United States Patent [19]

Kaegebein

[11] 4,206,428

[45] Jun. 3, 1980

[54] SERIES NOTCH FILTER AND MULTICOUPLER UTILIZING SAME

[75] Inventor: Daniel P. Kaegebein, Depew, N.Y.

[73] Assignee: TX RX Systems Inc., Angola, N.Y.

[21] Appl. No.: 952,011

[22] Filed: Oct. 20, 1978

[51] Int. Cl.² .................................. H03H 13/00

[52] U.S. Cl. .................................. 333/207; 333/176; 333/230

[58] Field of Search ................ 333/126, 176, 206–209, 333/211, 212, 230, 231; 343/180; 325/23, 24

[56] References Cited

U.S. PATENT DOCUMENTS

| | | | |
|---|---|---|---|
| 1,934,602 | 11/1933 | Gilman | 333/125 X |
| 2,484,798 | 10/1949 | Bradley | 333/230 X |
| 2,514,779 | 7/1950 | Martin | 333/135 |
| 2,637,782 | 5/1953 | Magnuski | 333/208 |
| 2,938,177 | 5/1960 | Vogelman | 333/126 |
| 3,124,768 | 3/1964 | Tilston | 333/126 |
| 3,537,041 | 10/1970 | Kommrusch | 333/207 X |
| 3,624,563 | 11/1971 | Burley et al. | 333/207 X |
| 3,717,827 | 2/1973 | Kaegebein | 333/207 |
| 3,815,137 | 6/1974 | Kaegebein | 343/180 |
| 3,876,963 | 4/1975 | Graham | 333/206 X |
| 3,925,739 | 12/1975 | Brownell et al. | 333/176 |
| 4,075,583 | 2/1978 | Kershaw | 334/45 X |
| 4,080,601 | 3/1978 | Alcorn, Jr. | 343/180 |

*Primary Examiner*—Eugene R. LaRoche

*Attorney, Agent, or Firm*—Bean, Kauffman & Bean

[57] ABSTRACT

A cavity notch filter (1) for series connection in a transmission line is disclosed which comprises a high Q cavity (2) containing therein an inductively coupled L-C series circuit (19). The notch filter (1) acts as a high series impedance at the resonant frequency of the cavity. At frequencies off resonance, the filter is characterized by low impedance so as to produce broad lateral pass bands.

A multicoupler (18) for connection of a plurality of signaling devices (15) to a single antenna (16) may be assembled to comprise two or more of the filters (1) inserted into the transmission line (17); each being tuned to resonate so as to produce a notch at the respective frequency of the signaling device (15). A different signaling device (15) is connected to each of the series connected notch filters (1) at a junction (7). Energy at all frequencies is then permitted to propagate down the line except the energy at the frequency of the respective signaling device (15). This frequency is blocked by the series notch filter (1) at the junction (7) and is diverted to the respective signaling devices (15).

30 Claims, 10 Drawing Figures

SERIES NOTCH FILTER AND MULTICOUPLER UTILIZING SAME

TECHNICAL FIELD OF THE INVENTION

The present invention relates to electrical filter networks for filtering selected frequencies. More specifically, the present invention relates to a series notch filter which utilizes, in combination, a high Q cavity filter and a series lumped constant reactive circuit to produce an electrical filter of improved characteristics. The present invention also relates to multicouplers such as diplexers and duplexers which include a novel filter network that incorporates the disclosed series notch filter. Accordingly, the general objects of the present invention are to provide novel and improved apparatus and methods of such character.

BACKGROUND OF THE INVENTION

In my prior U.S. Pat. Nos. 3,717,827 and 3,815,137 issued on Feb. 20, 1973 and June 4, 1974 respectively, as well as in prior U.S. Pat. No. 3,124,768 issued Mar. 10, 1964, interference problems in the field of radio communication are discussed. Briefly, these problems involve the simultaneous utilization of one antenna or transmission line with two or more transmitting and receiving pieces of equipment operating at carrier signals of different frequencies such as are found in multicouplers in general and in diplexers and duplexers specifically. My prior co-pending patent application Ser. No. 826,412 filed Aug. 22, 1977 is also concerned with and is directed to the design of filters and multicouplers assembled therefrom.

In order to properly isolate various pieces of equipment from one another, a number of filter networks are commonly utilized as is taught in the multicoupler of U.S. Pat. No. 3,124,768. Each such network includes a first cavity resonator and a quarter wavelength transmission line tuned to pass only the frequency of the signaling device connected to the network, and a second cavity resonator and a second quarter wavelength transmission line tuned to block only the frequency of the signaling device and to pass the frequencies of the other signaling devices. Each of the second cavity resonators and second transmission lines are connected in series and in turn are connected to the common antenna.

While the multicoupler taught in U.S. Pat. No. 3,124,768 is suitable for many applications, it nevertheless poses difficulties which have not heretofore been easily solved. A first difficulty of the prior art device is that the arrangement of cavity filters and quarter wavelength transmission lines required to act as transformers, require friction couplings to electrically join the cavity filters, the transmission lines, and the other components into a unified system. It is well known that friction couplings create intermodulation interference problems: the greater the number of friction couplings, the greater the intermodulation interference. Additionally, it is well recognized that transmission lines introduce insertion losses which create desensitization problems in the multicoupler. Since the prior art device taught in U.S. Pat. No. 3,124,768 requires a multiplicity of quarter wavelength transmission lines and a multiplicity of friction connectors, both intermodulation interference and insertion loss problems are present.

Thus, it is evident that an improved multicoupler with reduced numbers of required transmission lines and friction couplings is needed to reduce to a minimum the intermodulation interference and insertion loss problems of the prior art devices. Obviously, a multicoupler having smaller numbers of these components will also have the advantage of being significantly less expensive.

Typical prior known multicouplers utilize standard cavity pass band and notch filters as the resonating components in their networks. A standard notch cavity filter includes an electrically resonant cavity with a moveable co-axial electrically conducting center probe for tuning the resonant frequency and a coupling probe connected at one end to the transmission line and grounded at its opposite end on the interior of the cavity. In a multicoupler, the standard notch filter acts as a short circuit in the transmission line spaced off a quarter wave from the junction at which the high impedance is desired. Varying the position, length, profile, etc., of the coupling probe permits the inductive coupling between the cavity and the transmission line to be increased or decreased. Such variation of the inductive coupling increases or decreases the loading of the cavity and hence decreases or increases the impedance or depth of the notch of the filter.

While such adjustability is desireable, standard prior art notch cavity filters have the deficiency that variation of the notch depth by adjustment of the grounded electrical probe causes the resonant frequency of the cavity to shift. When the notch of the notch filter shifts in this manner, it detrimentally effects the performance of the multicoupler. Accordingly, if one wishes to vary the impedance of the reject band of the notch filter of prior art multicouplers, not only would the inductive coupling between the grounded coupling probe and the cavity have to be adjusted, but also the resonant frequency of the cavity itself would have to be adjusted so as to shift it back to the frequency of the respective signaling device.

Accordingly, in prior art multicouplers, adjustment of the multicoupler to obtain additional isolation or reduced isolation of a particular frequency involves a complicated readjustment of not only the inductive coupling of the cavity but also of the cavity resonant frequency. Conversely, modification of a multicoupler to accommodate a change in frequency of the carrier signal of the signaling device requires a dual adjustment of tuning the resonant frequency of the cavity and then varying the inductive coupling of the grounded probe into the cavity so as to compensate for the electrical effect caused on the depth of the notch by the variation of the resonant frequency of the cavity.

It is evident therefore that a notch filter having notch depth tuning characteristics and frequency tuning characteristics independent of one another is desireable and would be especially useful in the context of a multicoupler. With such a notch filter, the multicoupler could be adjusted and tuned in a variety of ways without involving a complicated interdependent fine tuning operation.

THE INVENTION

The series notch filter of the present invention and multicoupler utilizing same, avoids the defects and deficiencies of the prior art notch filters and multicouplers. The filter may be adjusted to shift its resonant frequency and therefore the frequency of the notch of the reject band without effecting its impedance or notch depth. Conversely, the impedance or depth of the notch may be adjusted to higher or lower values without appreciably shifting the resonant frequency of the filter.

Furthermore, the present series notch filter enables the construction of a multicoupler which minimizes the number of friction couplings and the number of interconnecting transmission lines. Accordingly, a multicoupler which includes the notch filter of the present invention is not only less expensive, but also is less plagued with the intermodulation interference and insertion loss problems of prior art multicouplers.

The notch filter of the present invention is adapted to be inserted into a transmission line and comprises a series lumped constant reactive circuit including a series connected inductive loop inductively coupled into a cavity resonator tuned to resonate at a predetermined frequency: the frequency of the reject notch of the filter. When connected in a transmission line, a series high impedance is created in the line by the filter at the resonant frequency of the cavity to produce the high impedance notch. At frequencies different from the resonant frequency of the cavity, the device exhibits low impedance so as to produce broad lateral pass bands on either side of the reject notch.

The series lumped constant reactive circuit of the notch filter may include a capacitance connected in series with the inductive loop. In order to obtain a symmetrical characteristic curve with broad pass bands on either side of the notch, the series lumped constant reactive circuit may be adjusted so that the capacitive reactance of the series lumped constant circuit equals the inductive reactance of the loop. Alternatively, the series lumped constant reactive circuit may be adjusted so that the capacitive reactance and the inductive reactance are not equal thereby producing an asymmetrical curve with increased roll-off on one side and decreased roll-off on the other.

In a preferred arrangement, the capacitance and the inductive loop of the lumped constant reactive circuit are disposed within a high Q quarter wave resonant cavity having a moveable electrically conductive center probe. The reactive circuit and particularly the series connected inductive loop are mounted to permit variation of the magnitude of the inductive coupling between the inductive loop and the cavity resonator. In the preferred form, the inductive loop is rotatably mounted within the cavity so that the inductive loop may be rotated to cause a variation of the amount of cavity magnetic field linked by the loop. An alternative form, with the capacitor mounted exterior to the cavity, is also possible although usually less desireable. Furthermore, it may be desireable to provide a variable capacitor so that the balance between the capacitive reactance and the inductive reactance may be readjusted to obtain a rejection curve of a particular asymmetrical shape.

The series notch filter of the present invention may be utilized to assemble a novel multicoupler for joining a plurality of transmitter and/or receiver signaling devices tuned to different frequencies to a common antenna. When so used, the series notch filter may be modified to include a junction adjacent to the inductive loop or at one end of the series lumped constant reactive circuit for joining a spur transmission line thereto. The multicoupler is then constructed by interrupting a transmission line at spaced positions and inserting therein the series notch filter of the present invention. Each of the different signaling devices are then connected into each of the different spurs associated with each of the series notch filters placed in the line. In order to best isolate each signaling device from the other signaling devices commonly connected to the antenna, a band pass filter may be inserted in the spur intermediate the signaling device and the series notch filter of the invention and spaced from the junction by a transmission line having an electrical length equal to a quarter wavelength of the average frequency of the band of frequencies handled by the multicoupler.

BRIEF DESCRIPTION OF THE DRAWINGS

The present invention may be better understood and its numerous objects and advantages will become apparent to those skilled in the art by reference to the accompanying drawings wherein like reference numerals refer to like elements in the several figures and in which.

DESCRIPTION OF THE BEST MODE OF THE INVENTION

Figure 2:
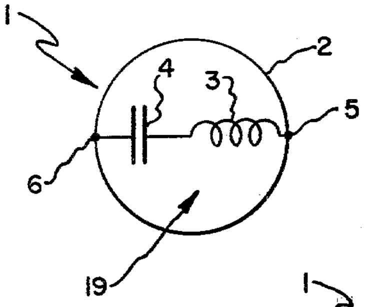
FIGS. 1, 2, 3 and 4 are schematic representations of different embodiments of the series notch filter of the present invention.

While the invention is susceptible of various modifications and alternative constructions, there is shown in the drawings and there will hereinafter be described, in detail, a description of the preferred or best known mode of the invention. It is to be understood, however, that the specific description and drawings are not intended to limit the invention to the specific form disclosed. On the contrary, it is intended that the scope of this patent include all modifications and alternative constructions thereof falling within the spirit and scope of the invention as expressed in the appended claims to the full range of their equivalents.

Figure 1:
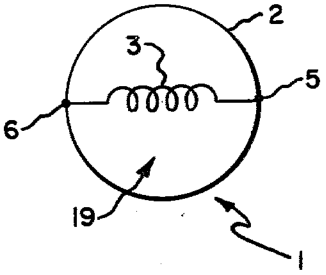

Having specific reference to the drawings wherein like parts are designated by the same reference numerals throughout the several views, the notch filter 1 of the present invention is schematically illustrated in its simplest form in FIG. 1 as comprising a resonant cavity 2 containing therein a series lumped constant reactive circuit 19 which includes at least an inductive loop 3. In order to distinguish from prior art notch filters and in recognition of the series connected reactive circuit portion of the filter of the present invention it will hereafter be referred to as the "Series Notch Filter".

Figure 3:
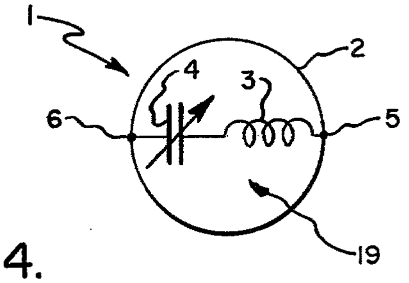
Figure 4:
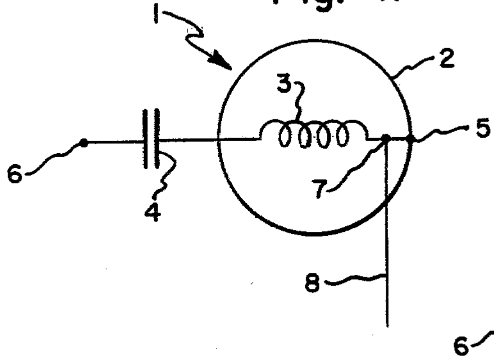

In the embodiments shown in FIGS. 2, 3 and 4, the series lumped constant reactive circuit 19 also includes a series connected capacitor 4. In all cases, circuit 19 is associated with the resonant cavity 2 in such a manner that inductive loop 3 is inductively coupled with the cavity but is electrically insulated from the walls of the cavity at the circuit's points of entry and exit as opposed to being electrically connected to the cavity. While other arrangements may be possible, the preferred means of inductively coupling inducitve loop 3 with the cavity is to physically locate the loop on the interior of the cavity as schematically illustrated in the figures. Opposite end terminals 5 and 6 of circuit 19 are shown and may comprise co-axial connectors which permit the series notch filter 1 to be inserted into a transmission line.

Figure 10:
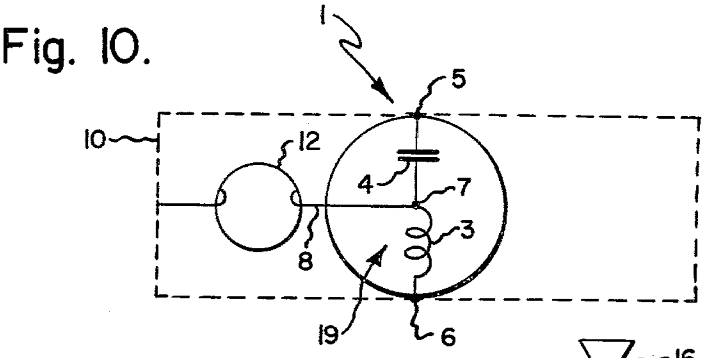
FIG. 10 is a schematic illustration of a second network which may be utilized in assembling a multicoupler in accordance with the invention.

FIG. 3 shows an alternate embodiment in which capacitor 4 is a variable capacitor and FIG. 4 shows an alternate embodiment in which capacitor 4 is disposed exterior to the cavity. These two alternate embodiments represent two of many possible variations to the basic series notch filter design: all of which include the general characteristic of an inductive loop insulated from but inductively coupled into a resonant cavity. FIG. 4 also shows an additional variation in which a spur conductor 8 is soldered or otherwise connected to the reactive circuit 19 at a junction point 7 adjacent to inductor 3. This modification is useful in the assembly of a multicoupler and eliminates at least one friction coupling of the prior art. Reference also should be made to FIG. 10 in which a schematic representation of another embodiment of the series notch filter of the present invention is shown and in which junction 7, while being adjacent to inductor 3, lies intermediate capacitor 4 and inductor 3.

Figure 5:
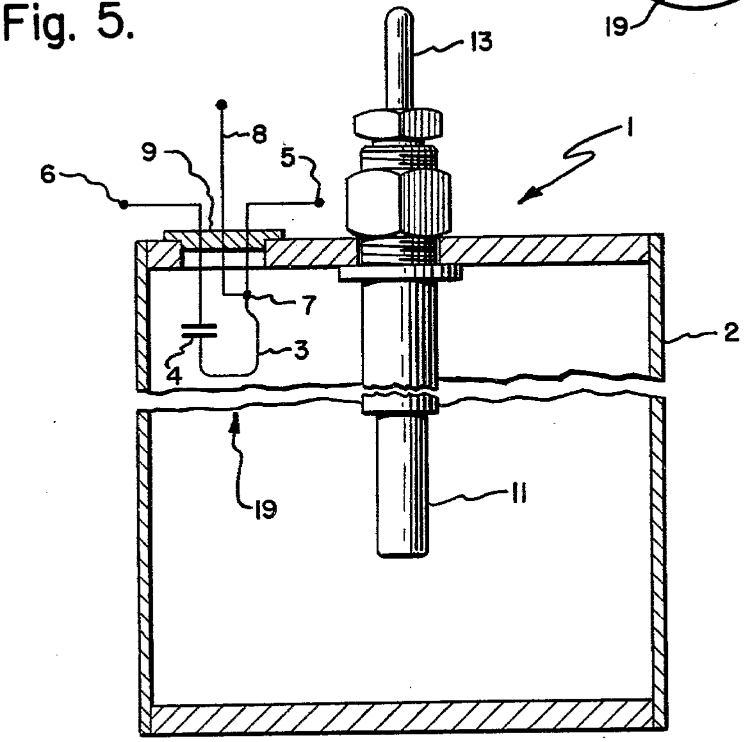
FIG. 5 is a semi-schematic illustration of a series notch filter of the present invention.

Turning now to an examination of FIG. 5, the series notch filter is illustrated in a semi-schematic manner as including a resonant cavity 2; a moveable electrically conducting center probe 11, which may be adjustably positioned external of the cavity by movement of probe stem 13; a series lumped constant reactive circuit 19, which includes an inductive loop 3 and a capacitance 4; and a spur conductor 8 connected to the reactive circuit 19 at junction 7. Reactive circuit 19 is mounted on a disk 9 which is rotatably fixed in a hole in the cavity wall so that the field within the cavity linked by loop 3 may be varied through rotation of circuit 19. Electrical connectors 5 and 6 are provided at opposite ends of the refractive circuit 19 and each of the leads which penetrate through disk 9 are electrically insulated therefrom so that the circuit is not grounded to cavity 2.

The series notch filter 1, when connected in series in a transmission line, responds differently at different frequencies to produce the notch filter characteristics. At the resonant frequency of the cavity, electro-magnetic energy is fed into the cavity by means of the inductive coupling between inductive loop 3 and the field of the cavity. The cavity resonates and overrides the characteristics of the lumped constant reactive circuit 19 to cause the reactive circuit to appear as a high impedance in series with the transmission line. At this frequency, therefore, the series notch filter 1 of the invention is analogous to an equivalent circuit in which a parallel resonant L-C circuit is connected in series with the line. It is this behavior and the resultant high impedance which creates the reject notch of the series notch filter.

Figure 7:
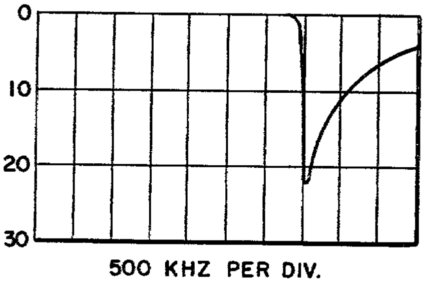
FIGS. 7 and 8 are graphical illustrations of asymmetric characteristic curves obtainable by relative adjustment of the capacitive reactance and the inductive reactance of the elements of the series notch filter of the present invention.

At other frequencies, the series lumped constant reactive circuit 19 merely acts as a distorted section of transmission line which permits the passage of energy therethrough. The series notch filter of FIG. 1 contains an inductive reactance unbalanced by an equal capacitive reactance so that its characteristic curve appears somewhat like the asymmetric characteristic curve illustrated in FIG. 7. As may be seen from an examination thereof, the shape of the curve demonstrates that frequencies on one side of the notch are passed with virtually no impedance up to a frequency quite close to the notch frequency so that the roll-off of the series notch filter on this side of the notch is quite rapid. On the other side of the reject notch, the roll-off is asymmetrical and is low compared to the roll-off found on the first side of the notch.

Figure 9:
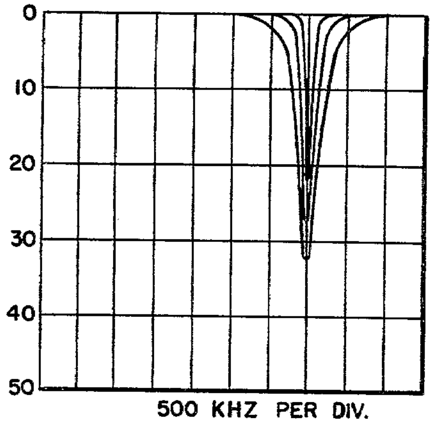
FIG. 9 is a graphical representation of three characteristic curves of a series notch filter with three different degrees of coupling between the lumped sum series circuit and the resonant cavity.
Figure 8:
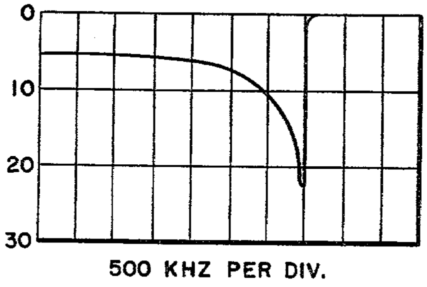

The series notch filter as shown in FIGS. 2, 3, 4 and 10 all include a lumped constant series reactive circuit 19 including a capacitor 4. If the capacitive reactance of capacitor 4 greatly exceeds the inductive reactance of the inductor 3, then the opposite extreme shown in FIG. 8 results with the asymmetry of the characteristic curve appearing on the other side of the notch. When capacitor 4 is selected to have a capacitive reactance which is equal to the inductive reactance of inductor 3, then a symmetrical characteristic curve results: three of which are illustrated in FIG. 9. As can be seen, a properly balanced series notch filter has a relatively sharp notch with excellent roll-off and broad pass bands on either side of the notch. As is illustrated by the three curves in FIG. 9, the roll-off of the series notch filter decreases as the depth of the notch or the impedance of the filter is increased.

The three different situations illustrated by the three curves in FIG. 9 in which the same series notch filter is adjusted to have three different notch depths, are obtained by causing the inductive coupling between loop 3 and the cavity 2 to be changed. As previously indicated, and as is evident from FIG. 5, rotation of mounting plate 9 in the hole in the cavity 2 causes a physical rotation of the inductive loop 3 so that a larger or smaller amount of the field within the cavity is linked by the loop. A particularly unique property of the series notch filter of the present invention is illustrated by FIG. 9 in that while rotation of loop 3 in the field of cavity 2 causes the depth of the notch of the filter to change, the frequency of the notch remains unchanged. Accordingly, in the series notch filter of the invention, the notch depth as well as the selectivity of the notch are independent of the notch frequency: contrasted to prior art notch filters which exhibit notch depth and notch frequency interdependency.

Figure 6:
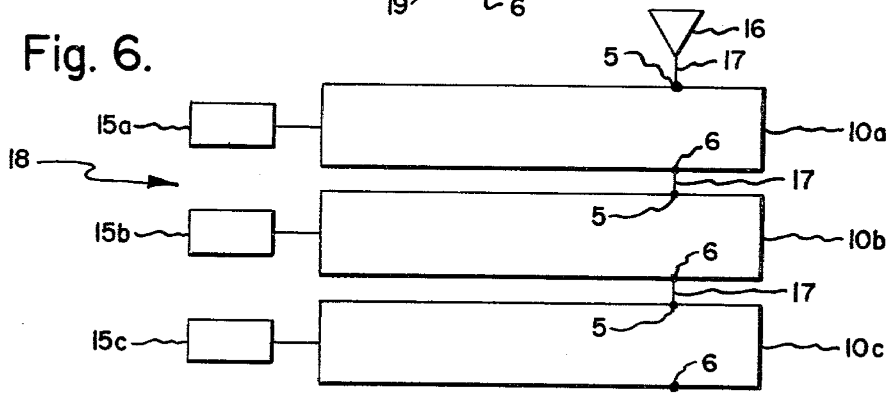
FIG. 6 is a schematic diagram of a multicoupler constructed in accordance with the present invention.

Turning now to FIGS. 6 and 10, an arrangement in which the series notch filter may be utilized to assemble a multicoupler is illustrated. Generally, the multicoupler is illustrated in FIG. 6 as comprising an antenna 16, a transmission line 17 interrupted by a plurality of filter networks 10 (10*a*, 10*b*, 10*c*) connected in series in the transmission line 17 at non-critical spaced positions therealong. Signaling devices 15 (15*a*, 15*b*, 15*c*), either transmitters or receivers, are connected respectively to one of the different filter networks 10*a* 10*b* or 10*c*.

A typical filter network 10 is schematically illustrated in FIG. 10 as including a series notch filter 1 having opposite connectors 5 and 6 at each end of the previously described intermediate series connected lumped constant reactive circuit 19. The circular line indicated at 2 represents a resonant cavity in which the inductor 3 of the reactive circuit 19 is physically located. An electrical spur 8 is joined to the reactive circuit 19 at junction 7 adjacent to inductor 3. Network 10 is oriented and serially connected into the transmission line 17 so that junction 7 is intermediate antenna 16 and inductor 3. With this orientation, energy having a frequency equal to the resonant frequency of cavity 2 and propagating down transmission line 17 from antenna 16 encounters the reactive circuit 19 and the inductive loop 3 and sees a high impedance or notch at junction 7.

Accordingly, the energy at the notch frequency is diverted along electrical spur 8 to the left. Electrical spur 8, at its opposite end, is coupled to a band pass filter 12 tuned to pass the energy at the notch frequency and to reject energy of all other frequencies. The opposite side of filter 12 is connected either to a plurality of similar band pass filters cavities 12 to increase selectivity and then to one of the signaling devices 15, or directly to one of the signaling devices 15. Spur 8 in conjunction with the loop coupling element of filter 12 is selected to be an odd number of quarter wavelengths at an average frequency of the band of frequencies for which the multicoupler 18, including signaling devices 15, has been designed. With spur 8 of this specific length, filter cavity 12 and spur 8 act as a transformer to create a high impedance at junction 7 to all of the frequencies in the line with the exception of the specific frequency to be passed. Thus, all of the rejected frequencies are blocked from entry into spur 8 and are diverted to propagate further along transmission line 17 through series notch filter 1 which demonstrates pass filter characteristics at those frequencies different from the tuned notch frequency.

Alternatively, multicouplers such as described above might include the series notch filter of FIG. 2 which differs from that shown in FIG. 10 in that the capacitor 4 and the inductor 3 are reversed so that inductor 3 is adjacent to connector 5. In this embodiment, junction 7 would appear intermediate inductor 3 and connector 5 rather than intermediate the capacitor and the inductor.

While a variety of preferred embodiments have been shown and described, it is yet possible to make further alterations which fall within the scope of the claims. For example, reactive circuit 19 may consist of an L-C-L or a C-L-C series circuit: each yielding variations in performance and applicability. Another example is that junction 7 may take a variety of positions in the variety of possible arrangements: many of which may be suitable for the performance of specific functions in specific applications. Accordingly, it is the intention of this patent to cover all modifications and constructions falling within the scope of the claims.

What is claimed is:

1. An electrical notch filter (1) for connection in series in a transmission line and for providing signal attenuation at a predetermined frequency characterized by:

a. a series lumped constant reactive circuit (19) including a series connected inductive loop (3), said circuit having first (5) and second (6) ends for series connection in a transmission line; and b. a cavity resonator (2) inductively coupled with but otherwise electrically insulated from said lumped constant reactive circuit, said cavity resonator being resonant at said predetermined frequency.

2. The notch filter (1) as recited in claim 1 characterized in that said series lumped constant reactive circuit (19) includes a capacitance (4) connected in series with said inductive loop (3).

3. The notch filter (1) as recited in claim 2 characterized in that both said inductive loop (3) and said capacitance (4) are disposed within said cavity resonator (2) whereby said inductive loop links the field within said cavity.

4. The notch filter (1) as recited in claim 2 characterized in that said capacitance (4) is disposed external to said cavity resonator (2) with said inductive loop (3) disposed within said cavity resonator (2).

5. The notch filter (1) as recited in claim 2 characterized in that said capacitance (4) includes a variable capacitor.

6. The notch filter (1) as recited in claim 2 characterized in that the capacitance (4) and the inductive loop (3) of said series lumped sum reactive circuit (19) are such that the capacitive reactance of said capacitance and the inductive reactance of said inductive loop (3) are equal.

7. The notch filter (1) as recited in claim 2 characterized in that said cavity filter (2) includes a coaxial cavity with a central lengthwise adjustable conductor (11) for adjusting said predetermined frequency.

8. The notch filter (1) as recited in claim 2 characterized by including means for changing the inductive coupling between said inductive loop (3) and said cavity resonator (2).

9. The notch filter (1) as recited in claim 8 characterized in that said inductive loop (3) of said series lumped constant reactive circuit 19 is mounted within said cavity (2) and includes means for permitting the variation of position of said inductor (3) within said cavity (2).

10. The notch filter (1) as recited in claim 9 characterized in that said means for permitting the variation of position of said inductor (3) within said cavity includes means (9) for rotatably mounting said inductive loop (3) within said cavity (2).

11. The notch filter (1) as recited in any one of claims 1, 2, 3, 7, 8, and 10 characterized by further including means connected to one end of said series lumped constant reactive circuit (19) for joining a spur transmission line (8) thereto.

12. A circuit for coupling a plurality of signaling devices (15) to a common transmission line (17) at spaced positions therealong to permit propagation of energy of all frequencies along said line in one direction but to block the propagation of energy at the frequency of any individual signaling device at its point of connection along said line in a reverse direction, characterized in that:

a. said line passes consecutively through a plurality of resonant cavities (2) at said spaced positions;

b. said line includes a plurality of lumped sum constant series circuits (19) connected in said line (17) in series with one another, each of said series circuits 19 including at least a series connected inductive loop (3) inductively coupled with one of said resonant cavities (2), each of said plurality of signaling devices (15) being electrically coupled with a different one of said plurality of resonant cavities (2), and each of said cavities (2) being tuned to the frequency of its respective signaling device (15).

13. The circuit as recited in claim 12 characterized in that said signaling devices (15) are coupled with said resonant cavities (2) by means of a transmission line (8) connected to said lumped sum constant series circuit (19) at a junction (7) at one side of said inductive loop (3).

14. The circuit as recited in claim 13 characterized in that said lumped sum constant series circuits (19) each include a capacitance (4) connected in series with its inductive loop (3).

15. The circuit as recited in claim 14 characterized in that each of the capacitances (4) is selected to have a capacitive reactance which is equal to the inductive reactance of the inductive loop (3) to which it is connected.

16. The circuit as recited in claim 12 characterized in that each said inductive loop (3) is disposed interior of said one of said resonant cavities (2) to which it is inductively coupled.

17. The circuit as recited in claim 12 characterized in that said lumped sum constant series circuits (19) each include a capacitance (4) connected in series with its inductive loop (3).

18. A multicoupler (18) for joining a plurality of transmitter and/or receiver signaling devices (15), tuned to different frequencies, to a common antenna (16), said multicoupler of the type which comprises a filter network (10) for each signaling device, said networks being connected in series with one another and in series with said antenna, each of said filter networks being of the type which include a first means (12) connected to the signaling device for passing the frequency of the signaling device, said first means including a cavity filter (12) coupled to a transmission line (8) having an effective electrical length equal to an odd multiple of a quarter wavelength corresponding to the frequency of the signaling device (15) of the network (10), and a second means (2) for providing high impedance to the frequency of the signaling devices of the network and low impedance to the frequencies of the other devices of the other networks, said multicoupler characterized in that said second means (2) comprises a cavity resonator (2) inductively coupled with but electrically insulated from a series lumped constant reactive circuit whose opposite ends (5,6) are connected in series with said antenna (16) and with the other series reactive circuits of the other networks (10), and in that said transmission line (8) is electrically connected to said series lumped constant reactive circuit at a position (7) intermediate said circuit and said antenna.

19. The multicoupler (18) as recited in claim 18 characterized in that said series lumped constant reactive circuit (19) includes an inductive loop (3) disposed within and inductively coupled with said cavity resonator (2).

20. The multicoupler (18) as recited in claim 19 characterized in that each cavity resonator (2) is tuned to resonate at the frequency of the signaling device of its network (10).

21. The multicoupler (18) as recited in claim 20 characterized in that said series lumped constant reactive circuit (19) includes a capacitance (4) connected in series with said inductive loop (3).

22. The multicoupler (18) as recited in claim 21 characterized in that both said inductive loop (3) and said capacitance (4) are disposed within said cavity resonator (2) whereby said inductive loop (3) links the field within said cavity (2).

23. The multicoupler (18) as recited in claim 21 characterized in that said capacitance (4) includes a variable capacitor.

24. The multicoupler (18) as recited in claim 21 characterized in that the capacitor (4) and the inductive loop (3) of said series lumped sum reactive circuit (19) are such that the capacitive reactance of said capacitance and the inductive reactance of said inductor are equal.

25. The multicoupler (18) as recited in claim 21 characterized in that said network (10) includes means for changing the inductive coupling between said inductive loop (3) and said cavity resonator (2).

26. The multicoupler (18) as recited in claim 25 characterized in that said inductive loop (3) of said series lumped constant reactive circuit (19) is mounted within said cavity (2) and includes means for permitting the variation of position of said inductor within said cavity.

27. The multicoupler (18) as recited in claim 26 characterized in that said means for permitting the variation of position of said inductor (3) within said cavity (2) includes means (9) for rotatably mounting said inductive loop (3) within said cavity (2).

28. The multicoupler (18) as recited in claim 19 characterized in that said transmission line (8) is electrically connected to one end of said inductive loop (3) within said cavity resonator (2).

29. A method of blocking the propagation of signals of a given frequency down a transmission line (15,17) characterized by the steps of:

a. connecting in series in said transmission line a series lumped constant reactive circuit (19) containing a series connected inductive loop (3);
b. inductively coupling said inductive loop (3) with a resonant cavity (2); and
c. tuning the resonant cavity (2) to resonate at said given frequency, thereby causing said inductive loop (3) to appear as a high impedance at said given frequency and to appear as a low impedance section of transmission line at frequencies other than said given frequency.

30. The method as recited in claim 29 further characterized by connecting a capacitor (4) in series with said inductive loop (3) and selecting the inductive reactance of said loop (3) and the capacitance reactance of said capacitor (4) to be substantially equal thereby producing symmetrical low impedance characteristics at frequencies above and below said given frequency.

* * * * *

UNITED STATES PATENT AND TRADEMARK OFFICE

CERTIFICATE OF CORRECTION

PATENT NO. : 4,206,428

DATED : June 3, 1980

INVENTOR(S) : Daniel P. Kaegebein

It is certified that error appears in the above-identified patent and that said Letters Patent are hereby corrected as shown below:

Col. 5, Line 2 - "inducitive" should be --- inductive ---.

Col. 5, Line 39 - "refractive" should be --- reactive ---.

Col. 7, Line 7 - "cavities" should be deleted.

Col. 7, Line 15 - "cavity" should be deleted.

Signed and Sealed this

*Fifth* Day of *August 1980*

[SEAL]

*Attest:*

SIDNEY A. DIAMOND

*Attesting Officer* *Commissioner of Patents and Trademarks*